United States Patent
Schiepp et al.

(10) Patent No.: US 9,847,160 B2
(45) Date of Patent: Dec. 19, 2017

(54) ACTUATOR DEVICE WITH RESETTING MEANS

(71) Applicant: ETO Magnetic GmbH, Stockach (DE)

(72) Inventors: Thomas Schiepp, Seitingen-Oberflacht (DE); Markus Laufenberg, Stockach (DE)

(73) Assignee: ETO Magnetic GmbH, Stockach (DE)

( * ) Notice: Subject to any disclaimer, the term of this patent is extended or adjusted under 35 U.S.C. 154(b) by 0 days.

(21) Appl. No.: 14/905,979

(22) PCT Filed: May 16, 2014

(86) PCT No.: PCT/EP2014/060095
§ 371 (c)(1),
(2) Date: Jan. 19, 2016

(87) PCT Pub. No.: WO2015/007416
PCT Pub. Date: Jan. 22, 2015

(65) Prior Publication Data
US 2016/0148736 A1 May 26, 2016

(30) Foreign Application Priority Data
Jul. 19, 2013 (DE) .......... 10 2013 107 744

(51) Int. Cl.
*H01H 7/08* (2006.01)
*H01F 7/08* (2006.01)
(Continued)

(52) U.S. Cl.
CPC .......... *H01F 7/08* (2013.01); *H01F 7/18* (2013.01); *H01L 41/12* (2013.01); *H02N 2/02* (2013.01)

(58) Field of Classification Search
CPC .. H01L 41/12; H01F 7/18; H01F 7/08; H02N 2/02
(Continued)

(56) References Cited

U.S. PATENT DOCUMENTS 7,246,489 B2 7/2007 Du Plessis et al.
2004/0206922 A1 10/2004 Du Plessis et al.
(Continued)

FOREIGN PATENT DOCUMENTS

DE 10 2005 038 891 A1 2/2007
DE 10 2009 014 304 A1 10/2010
(Continued)

OTHER PUBLICATIONS

International Apln No. PCT/EP2014/060095 search report dated Jan. 29, 2015.
(Continued)

*Primary Examiner* — Bernard Rojas
(74) *Attorney, Agent, or Firm* — Bachman & LaPointe, PC

(57) ABSTRACT

An actuator device for bidirectional adjustment of an adjusting body constructed for interaction with an adjustment partner and preferably realized as a tappet (14), having first adjustment means (10), which have expansion means having a magnetically effective shape-memory alloy material (12) and exerting an adjustment force, particularly a pushing force, on the adjusting body for moving the same along a first adjustment direction, which carry out an expansion generating the adjustment force as a reaction to a first energizing of first coil means (16), and second adjustment means (20; 20', 34) assigned to the adjusting body and provided separately from the expansion means and the first coil unit, which are constructed for moving the adjusting body in a second adjustment direction opposite to the first
(Continued)

adjustment direction, characterized in that the second adjustment means have an electromagnetically or electromotively driven actuator and therefore for moving the adjusting body in the second adjustment direction construct a drive, which can be activated as a reaction to signal loading, particularly a second electrical energizing.

12 Claims, 1 Drawing Sheet

(51) Int. Cl.
*H01L 41/12* (2006.01)
*H02N 2/02* (2006.01)
*H01F 7/18* (2006.01)

(58) Field of Classification Search
USPC ..... 335/220, 268; 251/129.06, 129.1, 129.15
See application file for complete search history.

(56) References Cited

U.S. PATENT DOCUMENTS

| | | | |
|---|---|---|---|
| 2006/0044093 A1* | 3/2006 | Ohta | H02K 57/006 |
| | | | 335/220 |
| 2010/0242673 A1 | 9/2010 | Laufenberg | |
| 2012/0043486 A1 | 2/2012 | Bouten | |
| 2015/0207059 A1* | 7/2015 | Laufenberg | H01L 41/06 |
| | | | 310/26 |

FOREIGN PATENT DOCUMENTS

| | | |
|---|---|---|
| DE | 10 2012 107 014 A1 | 2/2014 |
| WO | 2014019738 A1 | 2/2014 |

OTHER PUBLICATIONS

German Office action for Application No. 10 2013 107 744.7 dated May 22, 2014.

* cited by examiner

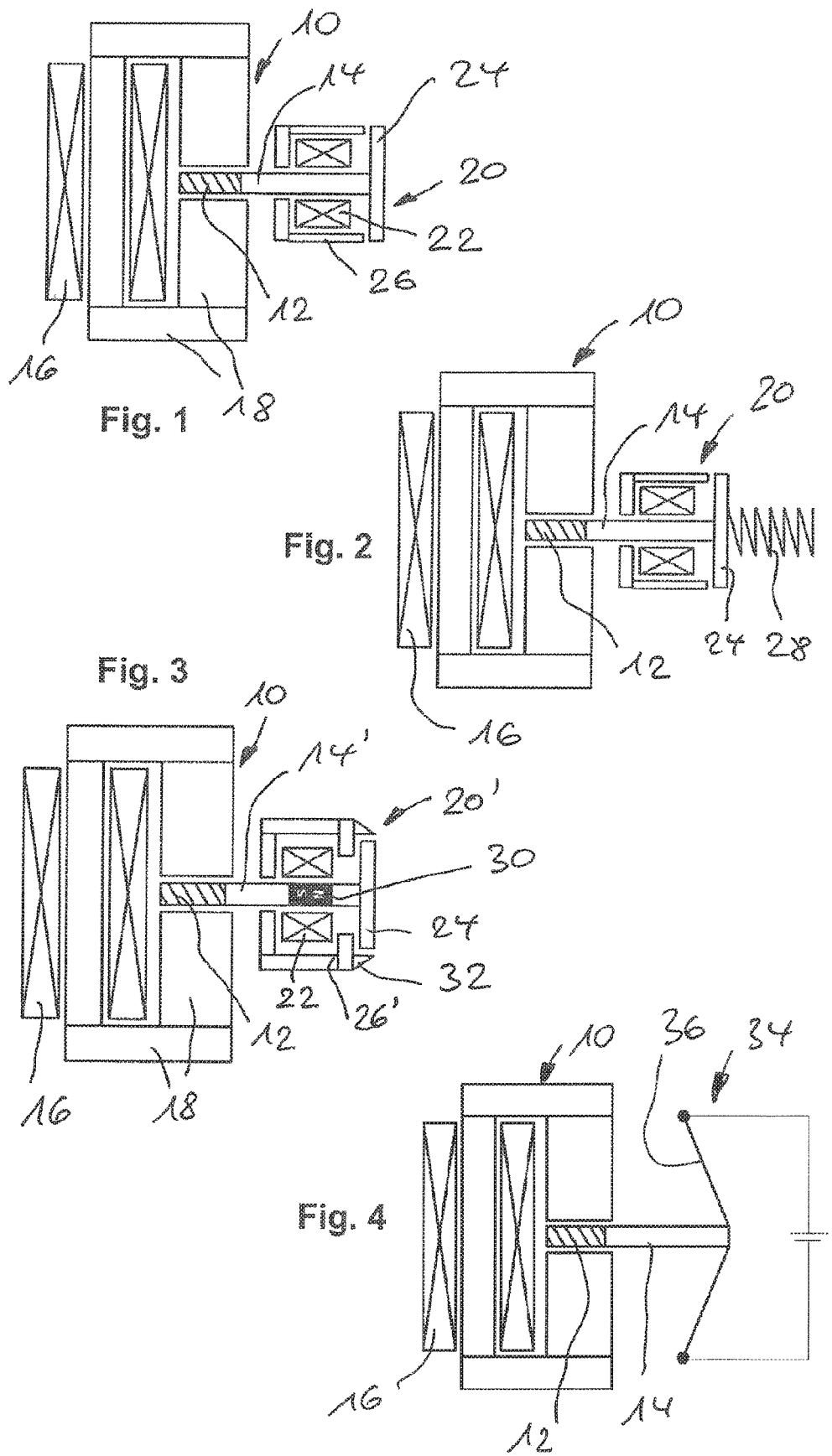

ACTUATOR DEVICE WITH RESETTING MEANS

BACKGROUND OF THE INVENTION

The present invention relates to an actuator device. A device of this type is known from DE 10 2009 014 304, and furthermore, US 2004/206922 A1 also shows one such device.

It is known from the prior art (and also from the underlying general actuator technology, which is assumed to be known), to use magnetically effective shape memory alloy materials (MSM materials=magnetic shape memory, here equivalent in meaning to 'magnetischer—FGL=Formgedächtnislegierung') for actuator technology. Thus, typically for this purpose, an MSM (FGL) crystal body (as a representative for a multiplicity of possible MSM-based materials), typically produced on the basis of an NiMnGa alloy, is loaded with a magnetic field generated by means of an energised coil. As a reaction to such a magnetic field loading, the MSM crystal body carries out an expansion movement as an expansion body or expansion means, the travel of which expansion movement generally runs in a direction perpendicular to the magnetomotive-force direction with the electromagnetically generated field. This expansion movement can then, at a driven end, drive an adjustment partner interacting suitably with this end, for example a generic adjusting body.

Thus, magnetically effective shape memory alloy materials of this type and actuators (actuator devices) realised using the same in the described principal manner offer an option to replace or to complement current magnet-based actuator principles—such as electromagnetic actuators for example. In the case of the magnetic shape memory alloy material used, in addition to constructive mechanical simplicity in terms of realisation (there is no armature that moves as a whole, it is merely an expansion of the expansion means that takes place), wherein a pivot lever here effects the force transmission between the individual actuators.

Also advantageous in the case of MSM-based push-push systems of this type is the fact that the adjusting body (suitably driven in an opposed manner longitudinally or rotationally) by both individual actuators is currentlessly stable at practically any adjustment position between end positions of the respective adjustment movements; in other words, by means of suitable control, an MSM push-push system of this type—which is assumed to form the generic type—is able to hold the adjusting body in currentlessly stable positions along the movement path—moved bidirectionally—and thus to carry out adjustment tasks in particular, which do not require permanent energising or position regulation, as long as external forces do not exceed a predetermined level.

Whilst a technology of this type is less affected by the previously explained problem of a reduced maximum expansion travel of the MSM expansion means, nonetheless, the realisation of a push-push system of this type by means of two interacting MSM actuators entails considerable hardware and component outlay, as for each individual adjustment element, not only a respective MSM expansion body, but also a respectively assigned coil unit, which generates the required magnetic field, including additional flux-conducting means and also mechanical coupling elements are required.

Reference is made to US 2010/242673 A1 for the additional prior art.

SUMMARY OF THE INVENTION

The object of the present invention is therefore to create an actuator device, which on the one hand improves the disadvantages of an MSM individual actuator reset using spring force or the like with regards to an adjustment travel which is limited and lies below a maximum possible expansion travel. On the other hand, the constructive or outlay disadvantages of mutually mechanically and mutually reciprocally resetting MSM individual actuators are to be overcome, so that an actuator device should be created, which combines a useful expansion and adjustment travel of the expansion means, which is improved considerably (and approaches the theoretical maximum crystalline expansion possibilities) with constructive simplicity and reliable resettability to an initial position.

The object is achieved by means of the actuator device with the features of the main claim, wherein according to the invention, an actuator device is created as a push-push system consisting of first and second adjustment means (and with just one MSM system), which can be controlled and energised independently of one another in each case, and thus overcome the principal functional advantages of known push-push systems compared to MSM individual actuators reset using spring force.

In this case, the present invention additionally achieves the underlying object in that it is not for example both adjustment means according to the invention that have a magnetically effective magnetic shape memory alloy material (MSM), rather this is only the case according to the invention for the first adjustment means, by contrast although the second adjustment means connected to or interacting with the first adjustment means via the adjusting body are initially configured to be likewise electrically energisable and activatable (or loadable using an electrical signal), they do not have a magnetically effective shape-memory alloy material. Rather, it is provided for these second adjustment means to be realised by means of an electromagnetically or electromotively operated actuator.

However, MSM-based actuator devices, which are assumed to be known, also have conceptual or construction disadvantages compared to other actuator principles, as a result of which, an effectively universal usability was hitherto limited in practice. Thus, for example, a useful travel of a longitudinal expansion movement (i.e. a stretch of a stretching movement carried out by the MSM crystal) is typically limited to approx. 3% to 6% of a corresponding extent of the crystal, so that straight large-travel movements can only be realised by means of FGL or MSM actuators with difficulty.

Furthermore, known MSM/FGL actuators have the characteristic that as a reaction to an applied magnetic field (a required minimum field strength), although the intended expansion movement takes place, after a dropping of this magnetic field (below the minimum threshold), a compression back to the original compressed state does not automatically take place. Rather, the crystal (expansion means) remains in the expanded position. It is therefore known from the prior art to realise a required reset (i.e. the returning of the expansion means to a non-expanded initial position) using reset means, which are realised as mechanical springs for example. A spring of this type exerts its spring force counter to the expansion direction. If the spring force of such a known reset spring, acting counter to an FGL crystal to be expanded, is correspondingly set up in such a manner that in the event of magnetic-field loading, the FGL material of the expansion means overcomes the counter force (reset force) of the spring, the intended expansion movement takes place. If the magnetic field then drops (below the required minimum field strength) following the end of the energisation, the spring force acting on the MSM crystal leads by contrast to a contraction back to the compressed initial position.

In particular however, such a resetting of an MSM actuator device by means of (mechanical or else magnetic) springs—which is assumed to be known from the prior art—requires however that the actuating force to be generated by the shape-memory alloy material when the required magnetic field is applied must always be greater than the mechanical (reset) force of the reset element, which is realised as a spring, so that an expansion and therefore an adjustment movement occurs at all. Due to a force/path characteristic of a mechanical reset spring, which is typically to be assumed to increase linearly, this often does not occur however specifically in an expanded end position (i.e. at the end of a maximum possible expansion travel) of MSM-based expansion means, so that reset means realised as mechanical springs or by means of permanent magnets, which act in a resetting manner on the expansion means, effectively limit the usability of a maximum expansion travel of these MSM expansion means to approximately 80% of a possible maximum expansion travel in practice.

It is furthermore to be assumed to be known from the prior art to mechanically couple a pair of expansion means realised by means of magnetically effective shape-memory alloy materials in such a manner that the same act against one another and thus an expansion of first adjustment means effects the resetting of the coupled second adjustment means and vice versa. A principle of this type, which provides either two longitudinally coupled or else rotationally coupled MSM actuator systems, is termed a push-push system and reference is made for example to U.S. Pat. No. 7,246,489 B2 for the first-mentioned principle. The applicant's DE 10 2009 014 304, which is mentioned as forming the generic type, in this respect clarifies a rotationally coupled system of two MSM adjustment means, wherein a pivot lever here effects the force transmission between the individual actuators.

Also advantageous in the case of MSM-based push-push systems of this type is the fact that the adjusting body (suitably driven in an opposed manner longitudinally or rotationally) by both individual actuators is currentlessly stable at practically any adjustment position between end positions of the respective adjustment movements; in other words, by means of suitable control, an MSM push-push system of this type—which is assumed to form the generic type—is able to hold the adjusting body in currentlessly stable positions along the movement path—moved bidirectionally—and thus to carry out adjustment tasks in particular, which do not require permanent energising or position regulation, as long as external forces do not exceed a predetermined level.

Whilst a technology of this type is less affected by the previously explained problem of a reduced maximum expansion travel of the MSM expansion means, nonetheless, the realisation of a push-push system of this type by means of two interacting MSM actuators entails considerable hardware and component outlay, as for each individual adjustment element, not only a respective MSM expansion body, but also a respectively assigned coil unit, which generates the required magnetic field, including additional flux-conducting means and also mechanical coupling elements are required.

The object of the present invention is therefore to create an actuator device, which on the one hand improves the disadvantages of an MSM individual actuator reset using spring force or the like with regards to an adjustment travel which is limited and lies below a maximum possible expansion travel. On the other hand, the constructive or outlay disadvantages of mutually mechanically and mutually reciprocally resetting MSM individual actuators are to be overcome, so that an actuator device should be created, which combines a useful expansion and adjustment travel of the expansion means, which is improved considerably (and approaches the theoretical maximum crystalline expansion possibilities) with constructive simplicity and reliable resettability to an initial position.

The object is achieved by means of the actuator device with the features of the main claim, wherein according to the invention, an actuator device is created as a push-push system consisting of first and second adjustment means (and with just one MSM system), which can be controlled and energised independently of one another in each case, and thus overcome the principal functional advantages of known push-push systems compared to MSM individual actuators reset using spring force.

In this case, the present invention additionally achieves the underlying object in that it is not for example both adjustment means according to the invention that have a magnetically effective magnetic shape memory alloy material (MSM), rather this is only the case according to the invention for the first adjustment means, by contrast although the second adjustment means connected to or interacting with the first adjustment means via the adjusting body are initially configured to be likewise electrically energisable and activatable (or loadable using an electrical signal), they do not have a magnetically effective shape-memory alloy material. Rather, it is possible and preferred according to a development for these second adjustment means to be realised by means of an electromagnetically or electromotively operated actuator, for example. Additionally or alternatively, these second adjustment means are to be configured by means of an electrically controllable piezo crystal, a bimetall, a thermally effective shape-memory alloy material and in turn additionally or alternatively by means of hydraulic or pneumatic means.

All of these variants make it possible according to the invention that during the first energising (and therefore magnetic-field loading of the MSM expansion means of the first adjustment means), the same are not braked or held during their expansion by a counter force for example, particularly before reaching an expansion maximum, rather it is substantially possible to exploit a maximum possible maximum expansion hub (for example predetermined due to the crystal conditions of the MSM crystal provided), so that according to the invention, at least 90%, further preferably at least 95% of this travel can also actually be converted to a movement of the adjusting body. Only a suitably controlled activation of the second adjustment means according to the invention, not realised as an SMS actuator, then leads to a resetting or, in accordance with a respective control, to an adjustment of the adjusting body to a desired intermediate position, which, in accordance with the previously described properties of the magnetic shape-memory alloy material, may be currentlessly stable.

Whilst it is provided in the context of the present invention, for realising the push-push system according to the invention of the actuator device, to configure the second adjustment means explicitly without magnetically effective shape-memory alloy material, it is nonetheless not excluded, that in spite of this, a reset functionality of the second adjustment means may be supported by means of mechanical spring means and/or permanent magnet means, which are set up for resetting, particularly if for example, a force-path characteristic of a reset support of this type is set up in such a manner that the same exerts a comparatively small resetting force in the region of the expanded state of the expansion means. Whilst for example, resetting by means of mechanical springs is known from DE 10 2005 038 891 A1 and should be considered included in the present disclosure as belonging to the invention with regards to a realisation of a spring support during resetting, DE 10 2012 107 014 of the applicant for example describes a permanent magnet resetting, in which permanent magnet means support a contraction of the expansion means to the non-expanded initial position. Even such a technology in connection with the second adjustment means according to the invention should be considered included in the present disclosure as belonging to the invention with regards to an actual realisation of a preferred embodiment of the present invention.

In a particularly preferred realisation of the present invention, it is provided either to realise the adjusting body according to the invention directly by means of the (MSM) expansion means or to connect to the same in a suitable manner, further preferably unreleasably, it can be imagined here for example that a suitably formed crystal body exerts the adjusting-body function itself at one end to realise the expansion means, or alternatively is connected to a corresponding section by means of welding or the like. As an alternative and in turn in the context of an advantageous embodiment of the invention, this adjusting body could form an armature section, for example an armature tappet, of the second adjustment means realised as electromagnet actuator, so that in the manner according to the invention, the adjusting body forms the mechanical connection between the first (MSM) adjustment means and the second (non MSM) adjustment means.

In the practical realisation of the invention, it is in this case possible to construct the adjustment movements linearly (at least in certain sections), wherein the adjustment means would then act in a manner directed towards one another for example in accordance with a line of this type, additionally or alternatively, the mechanical coupling could take place via the adjusting body (in turn at least in certain sections) in an arcuate, particularly circular arcuate, manner, for example in the manner of DE 10 2009 014 304, which is used to form the generic type.

Whilst it is additionally preferred according to a first realisation form of the invention and to reduce constructive outlay in the realisation, to allow the expansion means and a drive body, for example a tappet or the like, of the second adjustment means to act on the adjusting body directly, the invention nonetheless comprises assigning mechanically effective transmission or gearing means to the first and/or the second adjustment means, which enable an optimisation for a respective use purpose, if appropriate to influence the adjustment behaviour with regards to adjustment travel or adjustment force.

In particular, the present invention therefore comprises using the actuator device according to the invention as a push-push actuator for a multiplicity of adjustment purposes, particularly if the adjusting body should be brought into a plurality of (preferably currentlessly stable) intermediate positions between end positions of the first and the second adjustment devices, even if the invention similarly comprises the setting of just one such intermediate position. According to a development, it may in turn be provided and be advantageous to connect regulating means in a suitable manner upstream of the first and/or second adjustment means in such a manner that even in the event of deviations of a(n) (intermediate) position set in such a manner, a regulation to a predetermined position can take place by means of a suitable regulating function.

As a result, by means of the actuator device according to the invention, a way is created to overcome the constructive and design-related disadvantages acting on an MSM individual actuator and likewise to create a push-push actuator with little outlay, which does not require the constructive multiple outlay of a coupled pair of MSM individual actuators, with equally positive and effective switching and movement behaviour between the respective adjustment end positions of the first and second adjustment means.

BRIEF DESCRIPTION OF THE DRAWINGS

Further advantages, features and details of the invention result from the following description of preferred exemplary embodiments, as well as on the basis of the drawings. In the figures FIG. 1 shows a schematic longitudinal sectional illustration of the push-push actuator device according to a first embodiment;

FIG. 2 shows a realisation form of the actuator device as a second exemplary embodiment, which complements the exemplary embodiment of FIG. 1 with mechanical spring means;

FIG. 3 shows a variant of the exemplary embodiment of FIG. 2, wherein the mechanical spring means are replaced by a permanent magnet arrangement, and FIG. 4 shows a further exemplary embodiment of the invention, wherein the second adjustment means have a thermal shape-memory alloy material.

DETAILED DESCRIPTION

The conceptual schema diagram of FIG. 1 clarifies the principal structure of the actuator device according to the invention of a first exemplary embodiment. Thus, the first adjustment means are realised as MSM actuator 10, having elongated expansion means 12 in the form of a lug (appendage) on a tappet 14, which lug is realised from a magnetic shape-memory alloy material.

In an otherwise known manner, as a reaction to energising of a coil unit 16, the MSM body section 12 is loaded with a magnetic flux which is introduced via the flux-conducting core arrangement 18 shown in FIG. 1 into shell surfaces of the MSM expansion body and in an otherwise known manner effects the desired expansion along the horizontal direction in the figure plane of FIG. 1 when a critical magnetic flux density is exceeded.

The tappet having the MSM expansion body 12 at one end is, as FIG. 1 shows, simultaneously an electromagnetically actuated armature of the electromagnet arrangement 20 schematically shown in the right region of FIG. 1 as second adjustment means in the realisation of the invention: In turn, in the manner otherwise generally known from the prior art, this tappet, which is movably guided centrally in a coil arrangement 22, is actuated by means of an electromagnetic flux, which drives an end-side armature section 24 (which is movable together with the tappet 14 as armature) relatively to a stationary flux-conducting housing 26 when the coil unit 22 is energised, in order to close the flux circuit for the electromagnetically generated flux in this respect.

In the manner shown conceptually in FIG. 1, a push-push actuator is therefore created such that the first (MSM) adjustment means 10 trigger a tappet movement to the right in the figure plane of FIG. 1 as a reaction to energising of the first coil 16 by means of expansion of the expansion body 12, and thus bring the tappet 14 to a desired position (horizontal in the figure plane) as adjusting body. Energising of the second coil 22 (ideally in the case of deactivated energising of the first coil 16) then led to a movement of the armature 14, 24 in the opposite horizontal direction (i.e. to the left in the figure plane of FIG. 1) and in this manner resets the MSM expansion body 12—which is unreleasably connected to the tappet 14 by means of suitable welding or adhesive bonding—to its compressed or non-expanded initial position.

In this manner, a resetting of the MSM expansion means 11 is therefore enabled, without a relevant counter force counteracting the expansion movement, particularly during expansion operation, as energising of the coil 22 for tappet movement 14 generally does not take place during this expansion operation. It is an advantageous consequence that the expansion means 12 can carry out an expansion movement up to the expansion maximum (i.e. within the crystalline or physical possibilities), as a result of which in practice at least 90% of the maximum (physical) expansion travel, normally even at least 95% of this maximum expansion travel can be converted to the actuator movement according to the invention along the first adjustment direction.

As a variant to the exemplary embodiment of FIG. 1, FIG. 2 shows that additionally provided spring means in the form of a schematically shown pressure spring 28 prestress the armature 14, 24 of the second adjustment means 20 counter to the expansion direction of the expansion means 12. At the same time, a spring constant of these spring means 28 is chosen such that with deenergised electromagnet actuator device (second adjustment means) 20, the spring force is not sufficient to contract the MSM body 12 or reset the same to its non-expanded position. In this respect, the spring 28 schematically shown in FIG. 2, obtains the property of an additional hybrid reinforcement of a reset action, as is carried out by the electromagnet actuator device 20 counter to the expansion direction of the MSM body 12. It is included in the scope of the invention in this case, by means of a suitable combination of various active elements, for example the second adjustment means, which are to be energised actively, in connection with (passively acting) additional spring means 28, to create and to influence a desired movement, adjustment and reset behaviour of the entire arrangement. The exemplary embodiment shown with the spring 28 also has the advantage that in this manner, a one-piece configuration of the units 12, 14 (potentially disadvantageous—because it is connected with increased production outlay or difficult to install) can be avoided; in the case of a releasable connection of this type, the spring 28 would ensure that the freely movable armature 12 (for example in the case of a compressed element 12) is always brought to the MSM element with a (small) force, so that in the desired installation location, the modules 12, 14 are connected (and for example an adhesive bonding or welding or the like, to produce an unreleasable connection, becomes unnecessary).

A further variant of a procedure of this type clarifies the exemplary embodiment of FIG. 3, wherein in turn, identical reference numbers represent identical or identically acting functional components in all of the exemplary embodiments shown.

Here, the two adjustment means 20' are realised by the coil unit 22 provided within the yoke-core arrangement 26', wherein the tappet 14' has a permanent magnet 30, which is axially magnetised in the manner shown, in the central region thereof. In addition, a cone arrangement 32 is provided at the end side of the yoke core unit for influencing the magnetic flux course in the circuit, which in this respect influences the flux behaviour in combination with the armature section 24. In the exemplary embodiment of FIG. 4, an operation characteristic can therefore be created (in the manner of a "spring characteristic"), which applies practically no effective spring counter force, particularly in the critical end region of the MSM expansion close to the maximum travel, and therefore, in the advantageous manner according to the invention, allows a complete expansion of the expansion means and therefore a maximum adjustment travel of the first adjustment means. Also, depending on the use requirement and actual configuration, the described instruments of the permanent magnet or the cone arrangement are not necessarily to be used in combination; these can also be used individually or independently of one another in each case.

FIG. 4 shows a further embodiment of the present invention, wherein here, second adjustment means are assigned to the first adjustment means (which are configured analogously to FIGS. 1 to 3 in this respect) in the form of a thermal shape-memory alloy actuator 34. More precisely, FIG. 4 shows in a schematic illustration how a wire formed from a shape-memory alloy material 36, suspended on the armature tappet 14 at both ends, acts in such a manner that during energising of the FGL element 36 and the contraction effected thereby (by the heat generated by means of the ohmic resistance), a force loading resetting the component 12 is created. For the person skilled in the art, it is obvious that the schema of FIG. 4 can be realised in various ways in a mechanical-constructive manner and for example, the configuration of the thermal FGL as wire is exemplary for a multiplicity of possible realisation variants including heating technology.

The invention claimed is:

1. An actuator device for bidirectional adjustment of an adjusting body constructed for interaction with an adjustment partner (14), comprising
   first adjustment means (10), which have expansion means having a magnetically effective shape-memory alloy material (12) and exert an adjustment force, particularly a pushing force, on the adjusting body for moving the same along a first adjustment direction, wherein the first adjustment means carry out an expansion generating the adjustment force as a reaction to a first energising of first coil means (16), and
   second adjustment means (20; 20', 34) assigned to the adjusting body and provided separately from the expansion means and the first coil unit, which are constructed for moving the adjusting body in a second adjustment direction opposite to the first adjustment direction, wherein the second adjustment means have an electromagnetically or electromotively driven actuator as a drive for moving the adjusting body in the second adjustment direction, wherein the drive can be activated as a reaction to signal loading, particularly a second electrical energising, wherein mechanical spring means (28) and/or permanent magnet means (30) are assigned to the second adjustment means in such a manner that the same exert a spring and/or magnetic force acting in the second adjustment direction on the adjusting body.

2. The device according to claim 1, wherein the expansion means (12) are set up and interact with the adjusting body in such a manner that in the case of the first energising, over at least 80% of a maximum expansion travel of the expansion means, the movement of the adjusting body along the first adjustment direction is effected.

3. The device according to claim 1, wherein the first coil means and the second adjustment means have electrical control means, which are connected upstream in such a manner that the adjusting body can be kept currentlessly stable in at least one intermediate position between an end position of the first or the second adjustment direction.

4. The device according to claim 1, wherein the spring or magnetic force is set up in such a manner that it is smaller than a reset force for bringing the expansion means from an expanded to a compressed state.

5. The device according to claim 1, wherein the adjusting body (14) is realised by the expansion means (12) or connected to the same.

6. The device according to claim 1, wherein the movement of the adjusting body along the first or second adjustment direction takes place in a linear or arcuate manner at least in certain sections.

7. The device according to claim 1, wherein the first and the second adjustment means of mutually opposite and/or opposite attack positions, with respect to the adjusting body, interact with the adjusting body.

8. The device according to claim 1, wherein the first and second adjustment means constructing a drive section interact with the adjusting body in such a manner that the expansion of the expansion means and the movement of the drive section are transmitted directly to the adjusting body for moving the same.

9. The device according to claim 1, wherein the first and/or the second adjustment means constructing a drive section interact with the adjusting body by means of mechanically effective transmission and/or gearing means.

10. A use of the actuator device according to claim 1, as push-push actuator for adjusting the adjusting body into at least one currentlessly stable intermediate position between end positions of the first and the second adjustment direction.

11. The use according to claim 10, further comprising regulating means assigned to the first and/or the second adjustment means for holding the adjusting body in the at least one intermediate position.

12. An actuator device for bidirectional adjustment of an adjusting body constructed for interaction with an adjustment partner (14), comprising
first adjustment means (10), which have expansion means having a magnetically effective shape-memory alloy material (12) and exert an adjustment force, particularly a pushing force, on the adjusting body for moving the same along a first adjustment direction, wherein the first adjustment means carry out an expansion generating the adjustment force as a reaction to a first energising of first coil means (16), and
second adjustment means (20; 20', 34) assigned to the adjusting body and provided separately from the expansion means and the first coil unit, which are constructed for moving the adjusting body in a second adjustment direction opposite to the first adjustment direction, wherein the second adjustment means have an electromagnetically or electromotively driven actuator as a drive for moving the adjusting body in the second adjustment direction, wherein the drive can be activated as a reaction to signal loading, particularly a second electrical energising, wherein the adjusting body constructs an armature section of the second adjustment means realised as electromagnet (20), to which cone means (32) for influencing the electromagnetic adjustment and/or force behaviour are further preferably assigned.

* * * * *